United States Patent
Kang et al.

(10) Patent No.: US 6,727,024 B2
(45) Date of Patent: Apr. 27, 2004

(54) POLYALKYLENE OXIDE POLYMER COMPOSITION FOR SOLID POLYMER ELECTROLYTES

(75) Inventors: Yongku Kang, Daejeon (KR); Changjin Lee, Daejeon (KR); Seok Koo Kim, Daejeon (KR)

(73) Assignee: Institute of Chemical Technology (KR)

( * ) Notice: Subject to any disclaimer, the term of this patent is extended or adjusted under 35 U.S.C. 154(b) by 210 days.

(21) Appl. No.: 09/897,418

(22) Filed: Jul. 3, 2001

(65) Prior Publication Data

US 2003/0044688 A1 Mar. 6, 2003

(30) Foreign Application Priority Data

Mar. 13, 2001 (KR) .......................................... 2001-12913

(51) Int. Cl.$^7$ ................................................ H01M 6/18
(52) U.S. Cl. ...................... 429/317; 429/309; 429/310; 429/314; 429/316; 429/322; 429/323
(58) Field of Search ................................. 429/306, 309, 429/310, 317, 322, 323, 314, 316

(56) References Cited

U.S. PATENT DOCUMENTS

| | | | |
|---|---|---|---|
| 4,830,939 A | 5/1989 | Lee et al. | |
| 5,240,791 A | 8/1993 | Izuti et al. | |
| 6,395,429 B1 * | 5/2002 | Kang et al. | ................. 429/306 |

FOREIGN PATENT DOCUMENTS

KR         2001-4121       1/2001

OTHER PUBLICATIONS

Peter V. Wright, "Electrical Conductivity in Ionic Complexes of Poly(ethylene oxide)", Br. Polym. J. 1975, 7, pp. 319–327.

S. Pantaloni, et al., "Electrochemical Characterization of a Class of Low Temperature Conducting Polymer Electrolytes", Electrochimica Acta, vol. 34, No. 5, 1989, pp. 635–640.

Michiyuki Kono, et al., "Network Polymer Electrolytes with Free Chain Ends as Internal Plasticizer", J. Electrochem. Soc., vol. 145, No. 5, May 1998, pp. 1521–1527.

Peter M. Blonsky, et al., "Polyphosphazene Solid Electrolytes", J. Am. Chem. Soc. 1984, 106, 6854–6855.

V. de Zea Bermudez, et al., "Coordination of EU3 + Ions in Siliceous Nanohybrids Containing Short Polyether Chains and Bridging Urea Cross–Links", J. Phys. Chem. B 2001, 105, pp. 3378–3386.

M. Armand, et al., "Polymeric Solid Electrolytes", Second International Meeting on Solid Electrolytes, St. Andrews, Scotland, Sep. 20–22, 1978, pp. 1–4.

* cited by examiner

*Primary Examiner*—Laura Weiner
(74) *Attorney, Agent, or Firm*—Lowe Hauptman Gilman & Berner, LLP (57) ABSTRACT

The present invention relates to a polyalkylene oxide based polymer composition for solid polymer electrolytes having superior mechanical properties and ionic conductivity by comprising a cross-linking agent with at least two functional groups of phenyl alkyleneglycol acrylate substitited in core molecules; a softener of polyalkyleneglycol alkylether alkyl (metha)acrylate; a plasticizer of polyalkyleneglycol dialkylether; a initiator and lithium salt thus can be useful as an electrolyte for a high capacity lithium-polymer secondary battery for load leveling or electric vehicles as well as an electrolyte for a small capacity lithium-polymer secondary battery for portable information terminals such as a cellular phone and a notebook computer, and electronic products such as a camcorder.

17 Claims, 1 Drawing Sheet

Fig. 1

POLYALKYLENE OXIDE POLYMER COMPOSITION FOR SOLID POLYMER ELECTROLYTES

BACKGROUND OF THE INVENTION

1. Field of the Invention

The present invention relates to a polyalkylene oxide based polymer composition for solid polymer electrolytes, and more particularly, to a polyalkylene oxide based polymer composition for solid polymer electrolytes, which has superior mechanical properties as well as ionic conductivity by comprising a cross-linking agent with at least two functional groups of phenyl alkyleneglycol acrylate substituted in core molecules; a softener of polyalkyleneglycol alkylether alkyl(metha)acrylate; a plasticizer of polyalkyleneglycol dialkylether; a curable initiator and lithium salt and thus can be used as an electrolyte for a high capacity lithium-polymer secondary battery for load leveling or electric vehicles as well as an electrolyte for a small capacity lithium-polymer secondary battery for portable information terminals such as a cellular phone and a notebook computer, and electronic products such as a camcorder.

2. Description of the Prior Art

Electrochemical devices using solid electrolytes have advantages over the conventional ones using liquid electrolytes because they are free of a liquid leakage problem used to be present in the conventional ones, can provide batteries with high recharge/discharge efficiency, and can be prepared in the form of a film and also in a small size. In particular, the lithium-polymer batteries using polyalkylene oxide (PAO) based solid polymer electrolytes can be used in manufacturing batteries with improved energy density and the importance of these batteries have been greatly emphasized.

PAO based solid polymer electrolytes was first developed by P. V. Wight in 1975 (*British polymer Journal* 7, p.319), named as "ion-conducting polymer" by M. Armand in 1978, and its application into electrochemical apparatus is on the steady increase. Conventional solid polymer electrolytes form a complex comprising a polymer of electron-donor atoms, such as oxygen (O), nitrogen (N) and phosphorous (P), and a lithium salt. The well-known example of the above complex is the one prepared by polyethylene oxide (PEO) and a lithium salt. This complex shows such a low ion conductivity as $10^{-8}$ S/cm and thus it is not suitable for room temperature use but can be used as a power source of electrochemical apparatus operated at high temperature.

PAO based solid polymer electrolytes have high crystallinity at room temperature thus resulting in low ion conductivity because the chain segmental motion is restricted. To increase the chain segmental motion of solid polymer electrolytes, the crystalline domain within the polymer structure should be minimized. A series of studies as such were conducted by introducing a relatively short PAO as a side chain thus forming a comb-like polymer or by introducing a cross-linkable functional group at the end of PAO thus forming a network structure. Such studies revealed that branched solid polymer electrolytes such as polybismethoxyethoxyethoxyphosphazine [*J. Am. Chem. Soc.*, 106 (1984) 6845] or polybisethoxyethoxyethoxyvinylether [*Electrochim. Acta*, 34 (1989) 635] are also possible. U.S. Pat. No. 4,830,939 [*J. Electrochem. Soc.*, 145, 1521 (1998)] disclosed a method of manufacturing cross-linked polymer electrolytes by UV or e-beam radiation curing of a composition wherein acrylate of polyalkylene glycol, ion-conducting liquid and electrolytic salt are mixed together. U.S. Pat. No. 5,240,791 by YUASA Co., Ltd. in Japan disclosed solid polymer electrolytes cross-linked between PEO monoacryloyl monomers and PEO diacryloyl monomers. These cross-linked solid polymer electrolytes are mostly cured by high energy beam irradiation such as e-beam or UV light. These electrolytes can be prepared as self-supportive films after being cured, however, they tend to be easily fractured due to the deficiency in stretching or bending properties thus making it difficult to be used on lithium-polymer batteries unless they are directly coated on the batteries. Unexamined Published Korean Patent Application No. 2001-4121 by the present inventors, as a way to solve the above problems, discloses a method to improve the mechanical property of the polymer electrolytes by using cross-linkers having rigid 6-membered cyclic molecules with three poly(ethyleneglycol) acrylates.

SUMMARY OF THE INVENTION

As described above, the conventional cross-linked solid polymer electrolytes can be prepared as self-supportive films after being cured, but they can be easily fractured due to the lack of stretching or bending mechanical properties thus not enabling to be applied into lithium-polymer batteries unless they are directly coated. In an effort to further solve this problem, the inventors of the present invention figured out that a new type of a cross-linking agent is essential in developing a solid polymer electrolyte with much improved physical property as well as ion conductivity which differs greatly from a vinyl cross-linking agent or an acrylate having a bifunctional group or more than two functional groups wherein the functional group is linear or branched carbon backbone. The conventional cross-linking agents were unable to impart enough mechanical strength because they are usually in the form of a linear or a branched carbon backbone, and the inventors of the present invention improved the mechanical strength by modifying the central structure of a given cross-linking agent and completed this invention. Therefore, the object of this invention is to employ a novel cross-linking agent useful in manufacturing solid polymer electrolytes of a three-dimensional network structure wherein the cross-linking agent has at least two phenyl alkyleneglycol acrylates in the center of the linking molecule. Another object of this invention is to strengthen the ion conductivity as well as the mechanical strength thus providing solid polymer electrolytes suitable to be used in lithium-polymer secondary batteries.

DETAILED DESCRIPTION OF THE INVENTION

The present invention relates to a composition of polyalkylene oxide solid polymer electrolyte characterized by comprising (a)3–30% by wt of a lithium salt; (b)0.1–80% by wt of a cross-linking agent expressed by the following formula (I); (c)0.1–70% by wt of polyalkyleneglycol alkylether alkyl(metha)acrylate expressed by the following formula (II); (d) 0.1–80% by wt of a single compound or a mixture of at least two compounds selected from the group consisting of polyalkyleneglycol dialkylether expressed by the following formula (III) or a nonaqueous polar solvent; and (e)0.5–5% by wt of a curable initiator.

In the above formulas (I), (II) and (III), X represents wherein $X_1$ and $X_2$ represent a chain- or a branched alkyl group of $C_1$–$C_{10}$ or a haloalkyl group with a substituted halogen atom of $C_1$–$C_{10}$, respectively; R represents a linear chain- or a branched alkyl group of $C_1$–$C_{10}$; $R_1$, $R_2$, $R_3$, $R_4$, $R_5$, $R_6$ and $R_7$ represent a hydrogen atom or a methyl group, respectively; $R_8$, $R_9$ and $R_{10}$ represent a linear chain- or a branched alkyl group of $C_1$–$C_{10}$, respectively; j represents an integer of 2 or 3; and p, q and r represent an integer of 0–20, respectively.

The present invention also includes a novel cross-linking agent expressed as the following formula (Ia).

In the above formula (Ia), X represents wherein $X_1$ represents a linear chain- or a branched alkyl group of $C_1$–$C_{10}$ or a haloalkyl group with a substituted halogen atom of $C_1$–$C_{10}$; and R, $R_1$, $R_2$, $R_3$, $R_4$, $R_5$, $R_6$, $R_7$ and $R_8$, j, p, q and r are the same as defined in the above, respectively.

The present invention is explained in more detail as set forth hereunder.

The solid polymer electrolyte composition comprises a lithium salt, a cross-linking agent, a softener, a plasticizer and an initiator.

(A) There is no specific limitation on using lithium salt as long as it can be used for the conventional polymer electrolytes. Examples of conventional lithium salts include $LiClO_4$, $LiCF_3SO_3$, $LiBF_4$, $LiPF_6$, $LiAsF_6$ and $Li(CF_3SO_2)_2N$. The amount of lithium salt is 3–30% by wt of the total composition, preferably 5–15% by wt, however, the amount can be adjusted upon necessity.

(B) The cross-linking agent of the present invention, expressed in the above formula (I), is characterized by having two or three hard segments of phenyl alkyleneglycol acrylate are introduced around the linking center atom (X) and a benzene ring is also introduced to improve ion conductivity. This kind of a cross-linking agent is able to improve the mechanical property of the resulting solid polymer electrolytes such as stretching and bending properties, keep regular distances between linear or branched polymer chains, and produce three-dimensional solid polymer electrolytes having a network structure due to more than two unsaturated functional groups bound to the terminal end of hard segments. In particular, the solid polymer electrolytes having the novel cross-linking agent, as expressed in the above formula (I), are cross-linked by hard segments whose cross-linking center has more than two benzene molecules and thus can strengthen the mechanical property and maintain regular distances between linear or branched polymer backbones. Further, there is a softener as expressed in the above formula (III) at the terminal end of the cross-linking agent bound as a soft segment and this can increase the compatibility of the solid polymer electrolyte with low molecular weight polyalkylene oxide or a nonaqueous solvent. Examples of X include amount of cross-linking agent to be used is 0.1–80% by wt of the total composition, preferably 5–60% by wt, and more preferably 10–50% by wt.

(C) The solid polymer electrolyte composition of the present invention contains polyalkyleneglycol alkylether alkyl(metha)acrylate as a softener which has a primary functional group and is expressed in the formula (II) to help to form a network structure and dissociation of lithium salt as well as to improve the flexibility of the polymer electrolyte. Considering the purpose of imparting ion conductivity, adjusting the mechanical property and increasing the compatibility with a plasticizer, the amount of a softener to be used is 0.1–70% by wt of the total composition, preferably 5–60% by wt, and more preferably 10–40% by wt.

(D) The solid polymer electrolyte composition of the present invention also contains polyalkyleneglycol dialkylether or a non-aqueous polar solvent as a plasticizer which can dissociate lithium salt and is expressed in the formula (III). Generally, the conductivity of a solid polymer electrolyte correlates with the content of a plasticizer added and the more the amount of a plasticizer, the greater the conductivity. The conductivity of a given solid polymer electrolyte increases as the content of the plasticizer increases, however, this also decreases the mechanical property of a given solid polymer electrolyte thus not being able to produce a film or used in the process of manufacturing batteries. Considering the overall conditions, the amount of a plasticizer is used 0.1–70% by wt of the total composition, and 0.1–80% by wt at most. In the present invention, production of films less than 40 μm is possible even when a plasticizer is added up to 70% by wt of the total composition, and the tensile strength was higher than 3 Mpa and the maximum rate of stretching was higher than 30%. Further, there were no cracks with bendings at 90° or 180° thus showing excellent bending property.

Examples of the polyalkyleneglycol dialkylether used as a plasticizer as expressed in the formula (III) include polyethyleneglycol dimethylether, polyethyleneglycol diethylether, polyethyleneglycol dipropylether, polyethyleneglycol dibutylether, polyethyleneglycol diglycidylether, polypropyleneglycol dimethylether, polypropyleneglycol diglycidylether; a comonomer between polypropyleneglycol/polyethyleneglycol at the terminal end of dibutylether; and a copolymer among polyethyleneglycol/polypropyleneglycol/polyethyleneglycol blocks.

Examples of non-aqueous polar solvents used as a plasticizer include ethylenecarbonate, propylenecarbonate, butylenecarbonate, dimethyl carbonate, tetrahydrofuran, 2-methyltetrahydrofuran, 1,3-dioxolane, 4,4-dimethyl-1,3-dioxolane, 7-butyrolactone, acetonitrile and the like.

The solid polymer electrolyte composition of the present invention contains a polymerization initiator and both a photo initiator and a thermal initiator can be used. Examples of photo initiators include ethylbenzoin ether, isopropylbenzoin ether, α-methylbenzoin ethylether, benzoinphenyl ether, α-acyloxym ester, α,α-diethoxy acetophenone, 1,1-dichloroacetophenone, 2-hydroxy-2-methyl-1-phenylpropane-1-on[Darocure 1173 of Ciba Geiby Co., Ltd.], 1-hydroxycyclohexyl phenyl ketone[Irgacure 184 of Ciba Geiby Co., Ltd.], Darocure 1116, Irgacure 907, anthraquinone, 2-ethyl anthraquinone, 2-chloro anthraquinone, thioxanthone, isopropyl thioxanthone, chloro thioxanthone, benzophenone, p-chloro benzophenone, benzyl benzoate, benzoyl benzoate, Michler's ketone and the like. Examples of thermal initiators include azoisobutyronitriles, peroxides and the like. The above thermal initiators can be added 0.5–5.0% by wt to the total composition and the amount can be adjusted according to the mixing ratio of various oligomers or polymers being added together.

In the cross-linking agent used as an active ingredient of the solid polymer electrolyte composition of the present invention as expressed in the formula (I), the cross-linking agent expressed in the following formula (Ia) is a novel material which has never been used in production of solid polymer electrolytes and thus the present invention includes the cross-linking agent expressed in the following formula (Ia).

In the above formula (Ia), X represents wherein $X_1$ represents a chain- or a branched alkyl group of $C_1$–$C_{10}$ or a haloalkyl group with a substituted halogen atom of $C_1$–$C_{10}$; and R, $R_1$, $R_2$, $R_3$, $R_4$, $R_5$, $R_6$, $R_7$, $R_8$, j, p, q and r are the same as defined in the above, respectively.

The novel cross-linking agent expressed in the following formula (Ia) can be synthesized according the method shown in the following reaction scheme (I).

Scheme (I)

(1a)

In the above reaction scheme (I), L represents a halogen atom or a methanesulfonate group; n and m represent an integer of 0–20, respectively; and R, $R_1$, $R_2$, $R_3$, $R_4$, $R_5$, $R_6$, $R_7$, $R_8$, j, p, q and r are the same as defined in the above, respectively.

According to the above reaction scheme (I), 4-polyalkyleneoxidephenyl derivatives are synthesized either by a ring opening polymerization using a 4-hydroxyphenyl derivative and alkyleneoxide in the presence of a base catalyst or by a substitution reaction using the polyalkylene glycol with easily substitutable leaving group (L). Then, the synthesized 4-polyalkyleneoxidephenyl derivative and alkylacryloyl chloride are allowed to react in the presence of a base and finally the cross-linking agent expressed in the formula (Ia) is synthesized. The method employed in the reaction scheme (I) is a known method and a person pertinent to this art can perform the synthesis without any problem.

Hereunder is given an example of the process of manufacturing a solid polymer electrolyte film using the solid polymer electrolyte composition described above.

First, lithium salt, a softener and an initiator of an appropriate mixing ratio are added into a container and mixed together by using an agitator to produce a solution and then a cross-linking agent is added and mixed. To this mixture is added a initiator and the mixture is agitated to produce a mixed composition for manufacturing solid polymer electrolytes. Thus obtained solid polymer electrolyte compositions are coated with a proper thickness on the support membrane of a glass plate, teflon, polyolefin or commercial Mylar films and then cured by irradiating under UV light, e-beam, or γ-ray. Another method of obtaining a film with a certain thickness is to coat the composition mixture on a given support membrane, install thickness-controlling spacers on both ends of the support membrane, cover the support membrane with another support membrane, and then cure it by irradiating with one of the above curable irradiators or a heat source and produce the solid polymer electrolyte film.

The present invention provides a lithium-polymer secondary battery manufactured by using the above solid polymer electrolyte composition. The anode of the secondary battery is manufactured by lithium ion intercalating metal oxide/conductive material/binder while the cathode is manufactured by carbon active material/conductive material/ binder, lithium metal or lithium metal alloy. Examples of lithium metal oxides include lithium manganese oxide, lithium nickel oxide, lithium cobalt oxide, lithium vanadium oxide, their composite metal oxides, metal oxides wherein a part of which are substituted with transition metals, or compounds where oxygen or fluorine in active materials is substituted by sulfur. Examples of carbon active materials include amorphous carbons such as cokes, natural graphite, micro-fibrous graphite or bead-type mesocarbon, tins, or tin treated compounds. The processes of manufacturing lithium-polymer secondary batteries are carried out under the argon atmosphere at room temperature.

As described above, the solid polymer electrolyte composition of the present invention is characterized by having a novel cross-linking agent which can impart improved mechanical properties due to its peculiar chemical structure, wherein soft segments of polyethyleneoxide are introduced at the terminal ends of the cross-linking agent thus increasing the flexibility of the film of the electrolyte, and these improved properties of mechanical strength and ion conductivity enable the solid polymer electrolyte composition of the present invention to be well suited in manufacturing the lithium-polymer secondary batteries.

This invention is described in its preferred form with a certain degree of particularity, however, it is appreciated by those skilled in the art that the present disclosure of the preferred form has been made only by way of examples and that numerous changes in the details of the construction, combination, and arrangement of parts may be resorted to without departing from the spirit and scope of the invention.

PREPARATION EXAMPLE 1

Synthesis of 1,1,1-tris(4-polyethoxylate phenyl) ethane Triacrylate(EO/phenol=2; TEPTA 2EO)

5 g of 1,1,1-tris(4-hydroxyphenyl)ethane (1), 10.15 g of $K_2CO_3$ and 150 mL of purified DMF were added into an Erlenmeyer flask and agitated under a nitrogen atmosphere and then slowly added with 7.32 g of 2-(2-chloroethoxy) ethanol dropwisely which was dissolved in 30 mL of purified DMF. The mixture was allowed to react for 24 hr at 80–90° C. and cooled down to room temperature. The reaction remnant was filtered and DMF, used as a reaction solvent, was removed by vacuum distillation. The remaining product was dissolved in chloroform and extracted with water. The organic phase was separated and chloroform was evaporated. The remnant was purified by silica gel column chromatography using ethylacetate/methylalcohol (10/1) as eluent and 6.24 g of 0.016 mol 1,1,1-tris(4-polyethoxylate phenyl)ethane (2) was obtained. The yield was 67%.

$^1$H-NMR δ(ppm) 2.02(s, 3H), 3.59(q, 6H), 3.68(q, 6H), 3.78(q, 6H), 4.04(t, 6H), 6.70(d, 6H), 6.92(d, 6H); $^{13}$C-NMR δ(ppm) 30.77, 50.64, 61.82, 67.35, 69.75, 72.59, 113.78, 129.67, 142.12, 156.67

1 g of thus synthesized 1,1,1-tris(4-polyethoxylate phenyl)ethane and 0.556 g of triethylamine were dissolved in 100 L of choloroform in an Erlenmeyer flask and then slowly added with 0.476 g of acryloyl chloride dropwisely dissolved in chloroform at 0° C. while agitating. After the mixture was allowed to react for 2 hr, the solvent as well as unreacted triethylamine and acryloyl chloride were removed by evaporation under reduced pressure. The remnant was purified by silica gel column chromatography using ethylacetate/hexane (2/1) as eluent and 0.64 g of 0.016 mol 1,1,1-tris(4-polyethoxylate phenyl)ethane triacrylate(EO/phenol=2; TEPTA 2EO) was obtained. The yield was 50%.

$^1$H-NMR δ(ppm) 2.09(s, 3H), 3.84(m, 12H), 4.11(q, 6H), 4.34(q, 6H), 5.84(d, 3H), 6.17(q, 3H), 6.40(d, 3H), 6.79(d, 6H), 6.96(m, 6H); $^{13}$C-NMR δ(ppm) 31.13, 50.98, 64.05, 67.73, 69.68, 70.12, 114.14, 128.64, 129.98, 131.46, 142.41, 157.09, 166.55

PREPARATION EXAMPLE 2

Synthesis of 1,1,1-tris(4-polyethoxylate phenyl) ethane Triacrylate(EO/phenol=5; TEPTA 5EO)

5 g of 0.016 mol 1,1,1-tris(4-hydroxyphenyl)ethane (1), 2.69 g of 0.048 mol KOH and 150 mL of purified isopropanol were added into an Erlenmeyer flask and agitated under a nitrogen atmosphere until the mixture takes on orange color by being completely dissolved. The mixture was cooled down to room temperature and white crystals were obtained. These crystals were filtered, washed with heptane, dried under vacuum at 50° C. and 5.9 g of 1,1,1-tris(4-hydroxyphenyl)ethane potassium salt (3) was obtained. The yield was 86%.

$^1$H-NMR δ(ppm) 1.07(s,3H), 6.3(d,6H), 6.6(d,6H); $^{13}$C-NMR δ(ppm) 30.03, 50.01, 117.41, 129.98, 138.35, 161.86

1 g of thus synthesized 2.38 mmol 1,1,1-tris(4-hydroxyphenyl)ethane potassium salt (3) and 150 mL of purified isopropanol were added into a high pressure reactor and agitated. Under 6 atm at 100° C., 1.57 g of 0.0357 mol (n=5) was added into the reactor, agitated for 2 hr., cooled down to room temperature and neutralized with 0.428 g of acetic acid. The reaction mixture was vacuum distilled to remove DMF and acetic acid. 2.1 g of 1,1,1-tris(4-polyethoxylate phenyl)ethane (EO/phenol=5; (4)) was obtained. The yield was 91%.

$^1$H-NMR δ(ppm) 2.09(s, 1H), 3.70(m, 30H), 3.84(m, 15H), 4.09(m, 15H), 6.7(d, 6H), 6.95(d, 6H)

1 g of thus synthesized 1,1,1-tris(4-polyethoxylate phenyl)ethane (EO/phenol=5) (4), 0.2138 g of triethylamine were dissolved in 100 L of choloroform in an Erlenmeyer flask and then slowly added with 0.281 g acryloyl chloride dropwisely dissolved in chloroform at 0° C. while agitating. After the mixture was allowed to react for 2 hr, the precipitant was removed by filtration and the remnant was purified by a silica gel column chromatography using ethylacetate as eluent and 0.82 g 1,1,1-tris(4-polyethoxylate phenyl)ethane triacrylate(EO/phenol=5; TEPTA 5EO) was obtained. The yield was 73%.

$^1$H-NMR δ(ppm) 2.09(s, 3H), 3.84(m, 41H), 4.11(q, 6H), 4.34(q, 6H), 5.84(d, 3H), 6.17(q, 3H), 6.40(d, 3H), 6.79(d, 6H), 6.96(m, 6H); $^{13}$C-NMR δ(ppm) 31.13, 50.98, 64.05, 67.73, 69.68, 70.12, 114.14, 128.64, 129.98, 131.46, 142.41, 157.09, 166.55

PREPARATION EXAMPLE 3

Synthesis of 1,1,1-tris(4-polyethoxylatephenyl) ethane Triacrylate(EO/phenol=10; TEPTA 10EO)

1,1,1-tris(4-polyethoxylate phenyl)ethane (EO/phenol=10; TEPTA 10EO) was synthesized as in the preparation example 2 by using 1 g of 1,1,1-tris(4-hydroxyphenyl) ethane potassium salt (3) and 3.14 g of ethylene oxide. 1,1,1-tris(4-polyethoxylatephenyl) ethane triacrylate(EO/phenol=10; TEPTA 10EO) was obtained by acrylation of thus synthesized 1,1,1-tris(4-polypropoxylate phenyl)ethane (PO/phenol=5). The yield was 71%.

$^1$H-NMR δ(ppm) 2.09(s, 3H), 3.84(m, 112H), 4.11(q, 6H), 4.34(q, 6H), 5.84(d, 3H), 6.17(q, 3H), 6.40(d, 3H), 6.79(d, 6H), 6.96(m, 6H); $^{13}$C-NMR δ(ppm) 31.13, 50.98, 64.05, 67.73, 69.68, 70.12, 114.14, 128.64, 129.98, 131.46, 142.41, 157.09, 166.55

PREPARATION EXAMPLE 4

Synthesis of 1,1,1-tris(4-polypropoxylate phenyl) ethane Triacrylate(PO/phenol=5; TPPTA 5PO)

1,1,1-tris(4-polypropoxylate phenyl)ethane (PO/phenol=5) was synthesized as in the preparation example 2 by using 1 g of 1,1,1-tris(4-hydroxyphenyl)ethane potassium salt (3) and 2.07 g of propylene oxide. 1,1,1-tris(4-polypropoxylate phenyl)ethane triacrylate (PO/phenol=5; TPPTA 5PO) was obtained by acrylation of thus synthesized 1,1,1-tris(4-polypropoxylate phenyl)ethane (PO/phenol=5). The yield was 80%.

$^1$H-NMR δ(ppm) 1.19(d, 45H), 2.09(s, 3H), 3.42☐3.94 (m, 40H), 5.10(s, 3H), 5.79(d, 3H), 6.13(q, 3H), 6.39(d, 3H), 6.79(d, 6H), 6.98(d, 6H)

PREPARATION EXAMPLE 5

Synthesis of 4,4'-sulfonyldiphenylpolyethoxylate diacrylate(EO/phenol=5; SPEDA 5EO)

4,4'-sulfonyldiphenylpolyethoxylate diacrylate(EO/phenol=5; SPEDA 5EO) was synthesized as in the preparation example 2 by using 4,4'-sulfonyldiphenol (5). The yield was 60%.

$^1$H-NMR δ(ppm) 2.09(s, 3H), 3.84(m, 30H), 4.11(q, 6H), 4.34(q, 6H), 5.84(d, 3H), 6.17(q, 3H), 6.40(d, 3H), 7.25(d, 4H), 8.20(d, 4H); $^{13}$C-NMR δ(ppm) 31.13, 50.98, 64.05, 67.73, 69.68, 70.12, 114.54, 129.64, 132.98, 131.46, 142.41, 163.09, 166.55 was added dropwisely at 0° C. while agitating. After the mixture was allowed to react for 2 hr, the precipitant was removed by filtration and the solvent was evaporated under reduced pressure. The resulting yellowish viscous product was dissolved in chloroform and then extracted three times with water. The chloroform layer was separated, dried and evaporated under reduced pressure and finally about 1.16 g of bisphenol A polyethoxylate diacrylate(EO/phenol=5; BPADA 5EO) was obtained. The yield was 93%.

$^1$H-NMR δ(ppm) 1.55(s, 6H), 3.65(m, 25H), 3.77(t, 5H), 4.02(t, 5H), 4.24(t, 5H), 5.75(d, 2H), 6.09(q, 2H), 6.35(d, 2H), 6.73(d, 4H), 7.04(d, 4H); $^{13}$C-NMR δ(ppm) 31.42, 42.05, 64.09, 67.69, 69.49, 70.16, 71.01, 71.18, 114.30, 128.07, 128.67, 131.4, 143.68, 156.95, 166.55

PREPARATION EXAMPLE 6

Synthesis of Bisphenol A Polyethoxylate Diacrylate (EO/phenol=5; BPADA 5EO)

1 g of bisphenol A polyethoxylate (EO/phenol=5) (8), 0.302 g of triethylamine were dissolved in 100 L of methylene chloride in an Erlenmeyer flask and then 0.27 g of acryloyl chloride which was dissolved in chloroform slowly

EXAMPLE 1

Ion Conductivity

Fabrication of a Conducting Film 1 g of 1,1,1-tris(4-polyethoxylate phenyl)ethane triacrylate(EO/phenol=5; TEPTA 5EO) synthesized in the preparation example 2, 1.551 g of polyethylene glycol monomethacrylate monomethyl ether (MW=400, "PEGM 400"), 2.551 g of poly(ethylene glycol) dimethylether (MW=250, "PEGDMe 250") and 0.06 g of dimethoxyphenyl acetophenone (DPMA) were mixed together. 0.71 g of lithium trifluoromethanesulfonate($CF_3SO_3Li$) was added to this mixture and the mixture was coated on top of the conductive glass plate of a band shape. The glass plate was irradiated for about 30 min by UV ray at 350 nm under a nitrogen atmosphere and finally a polymer film with excellent transparency and adhesiveness was manufactured.

Experiment of Ion Conductivity

Ion conductivity measurement was carried out using a band-type conductivity cell or a typical sandwich-type cell. The band-type conductivity cell was fabricated by indium-tin oxide conducting glass (ITO). ITO was patterned using masking tapes. The gap between the conducting band was 0.5–2 mm and length and width of the band were 5~10 mm. Lithium-copper foil or stainless steel plate was used electrode for sandwich type cell. The polymer electrolyte composition was coated on cell and cross-linked by radiation curing. The AC impedance between electrodes measured by using a frequency analyzer.

The composition of the solid polymer electrolytes was modified as shown in the following table 1, and the results of the conductivity of thus prepared films measured at room temperature by the above-mentioned method are shown in the table 1.

TABLE 1

| TEPTA 5EO | PEGM 400 | PEGDMe 250 | $CF_3SO_3Li$ | DMPA | $\sigma \times 10^{-4}$ (S/cm) |
|---|---|---|---|---|---|
| 1 g | 1.551 g | 0 g | 0.341 g | 0.029 g | 0.4 |
| 1 g | 1.551 g | 0.283 g | 0.382 g | 0.032 g | 1.2 |
| 1 g | 1.551 g | 1.093 g | 0.499 g | 0.041 g | 2.5 |
| 1 g | 1.551 g | 2.551 g | 0.71 g | 0.029 g | 4.3 |
| 1 g | 1.551 g | 5.950 g | 1.202 g | 0.097 g | 7.3 |

The results of measurements of ion conductivity at room temperature of films prepared using the electrolytes, wherein 1M $LiPF_6$ dissolved in a mixed solution of ethylene carbonate(EC) and dimethylcarbonate(DMC) (1:1) was used as a plasticizer instead of PEGDMe, are shown in the following table 2.

TABLE 2

| TEPTA 5EO | PEGM 400 | EC/DMC = 1:1 $LiPF_6$ 1M | DMPA | $\sigma \times 10^{-4}$ (S/cm) |
|---|---|---|---|---|
| 1 g | 1.551 g | 0.283 g | 0.028 g | 0.42 |
| 1 g | 1.551 g | 1.093 g | 0.036 g | 2.10 |
| 1 g | 1.551 g | 2.551 g | 0.051 g | 25 |
| 1 g | 1.551 g | 5.950 g | 0.085 g | 38 |

The results of measurements of ion conductivity at room temperature of films prepared using the electrolytes, wherein bisphenol A polyethoxylate diacrylate (EO/Phenol=5; BPADA 5EO) was used as a cross-linking agent instead of 1,1,1-tris(4-ethoxylate phenyl)ethane triacrylate (EO/Phenol=5; TPPEA 5EO), are shown in the following tables 3 and 4.

TABLE 3

| BPADA 5EO | PEGM 400 | PEGDMe 250 | EC/DMC = 1:1 $LiPF_6$ 1M | DMPA | $\sigma \times 10^{-4}$ (S/cm) |
|---|---|---|---|---|---|
| 1 g | 1.5 g | 1.498 g | 0.999 g | 0.049 g | 3.95 |
| 1 g | 1.5 g | 0.999 g | 1.498 g | 0.049 g | 5.78 |
| 1 g | 1.5 g | 0.499 g | 1.988 g | 0.049 g | 9.92 |
| 1 g | 1.5 g | 0.249 g | 2.247 g | 0.050 g | 34.45 |

TABLE 4

| BPADA 5EO | PEGM 400 | EC/DMC = 1:1 $LiPF_6$ 1M | DMPA | $\sigma \times 10^{-4}$ (S/cm) |
|---|---|---|---|---|
| 1 g | 1.5 g | 0.624 g | 0.030 g | 0.34 |
| 1 g | 1.5 g | 1.070 g | 0.036 g | 1.53 |
| 1 g | 1.5 g | 1.665 g | 0.042 g | 4.64 |
| 1 g | 1.5 g | 2.497 g | 0.050 g | 38.5 |

EXAMPLE 2

Tensile Strength and Flexibility of Electrolytic Films According to the Cross-linking Agent Ion conductivity, tensile strength and bending mechanical property of the films prepared using solid polymer electrolytes were examined by using cross-linking agents such as TEPTA 2EO, TEPTA 5EO, TEPTA 10EO, TPPTA 5PO, SPEDA 5EO, BPADA 5EO and a commercially available BPADA 2EO synthesized in the preparation examples 1–6.

The mixtures used in the preparation of electrolytic compositions contained 10 g of a cross-linking agent, 15.51 g of polyethylene glycol monomethacrylate monomethyl ether (MW 400, "PEGM 400"), 25.51 g of poly(ethylene glycol) dimethylether (MW 250, "PEGDMe 250"), 0.6 g of dimethoxyphenylacetophenone ("DPMA") and 7.1 g of lithium trifluoromethanesulfonate ($CF_3SO_3Li$). Tensile strength was measured by using an instrument from Series IX Automated Materials Testing System (Instron Co., Ltd. USA) and the thickness of the films prepared was approximately 100 μm. The flexibility of the films was investigated by observing the presence of a crack when a given film is bent 90° or 180° on a rod(φ=3 mm) and the thickness of the films prepared was approximately 100 μm. The ion conductivity, tensile strength and bending mechanical property of the films are shown in the following table 5.

TABLE 5

| Cross-linking Agent | Ion Conductivity $\sigma \times 10^{-4}$ (S/cm) | Tensile Stength (Mpa) | Flexibility | |
|---|---|---|---|---|
| | | | 90° | 180° |
| TEPTA 2EO | 2.7 | 2.5 | ⊗ | ⊗ |
| TEPTA 5EO | 4.3 | 4.5 | ⊗ | ⊗ |
| TEPTA 10 EO | 4.5 | 3.5 | ⊗ | ⊗ |
| TPPTA 5PO | 2.8 | 3.2 | ⊗ | ⊗ |

TABLE 5-continued

| Cross-linking Agent | Ion Conductivity σ × 10⁻⁴ (S/cm) | Tensile Stength (Mpa) | Flexibility 90° | 180° |
|---|---|---|---|---|
| SPEDA 5EO | 4.0 | 3.5 | ⊗ | ⊗ |
| BPADA 5EO | 3.8 | 4.0 | ⊗ | ⊗ |
| BPADA 2EO | 3.0 | 3.0 | ⊗ | ⊗ |

⊗: No Crack

The solid polymer electrolytic films prepared using plyethyleneglycol dimethacrylate (MW 400, "PEGDMA 400") and tris(2-acryloyloxyethyl) isocyanurate ("TAcEI"), conventional cross-linking agents, and different amount of PEGDMe 250 were measured for their ion conductivity and the tensile strength and the results are shown in the following table 6.

TABLE 6

| Cross-linking Agent | PEGDMe 250 Content (wt %) | Ion Conductivity σ × 10⁻⁴ (S/cm) | Tensile Stength (Mpa) | Flexibility 90° | 180° |
|---|---|---|---|---|---|
| PEGDA 400 | 50 | 2.3 | <1* | ⊠ | x |
| PEGDA 400 | 70 | ** | <1* | x | x |
| TacEI | 30 | 1.5 | 1.5 | ⊠ | x |
| TacEI | 50 | 3.5 | <1 | ⊠ | x |
| TacEI | 70 | 5.8 | <1 | x | x |

*Unable to measure Tensile Strength because it is too low.
**: Film cannot be formed.
⊠: No Crack
x: Presence of Crack In the above table 6, films were formed when the composition contained less than 50% of PEGDMe 250 in case of using PEGDA 400 as a cross-linking agent, however, films were not formed when the content of PEGDMe 250 was above 50%. In contrast, films were formed when the composition contains up to 70% of PEGDMe 250 in case of using TAcEI as a cross-linking agent, however, the tensile strength and the flexibility of these films were much deteriorated.

The ion conductivity and the tensile strength of solid polymer electrolytic films prepared using BPADA 2EO as a cross-linking agent without adding PEGM 400 and changing the content of PEGDMe 250 were measured and the results are shown in the following table 7. According to the table 7, the electrolytic salts were not well dissolved when the composition contained less than 30% of PEGDMe 250, whereas the ion conductivity decreased due to a phase separation when the composition contains up to 70% of PEGDMe 250. The tensile strength and the flexibility were also inferior to the films prepared suing PEGM as a cross-linking agent.

TABLE 7

| Cross-linking Agent | PEGDMe 250 Content (wt %) | Ion Conductivity σ × 10⁻⁴ (S/cm) | Tensile Stength (Mpa) | Flexibility 90° | 180° |
|---|---|---|---|---|---|
| BPADA 2EO | 30 | * | * | * | * |
| BPADA 2EO | 50 | 2.2 | 2.5 | ⊠ | x |
| BPADA 2EO | 70 | 2.0** | 2.2 | ⊠ | x |

*: Electrolytic Salt is not dissolved
**Presence of PEGDMe phase separation
⊠No Crack
x: Presence of Crack

EXAMPLE 3

Electrochemical Stability

Figure 1:
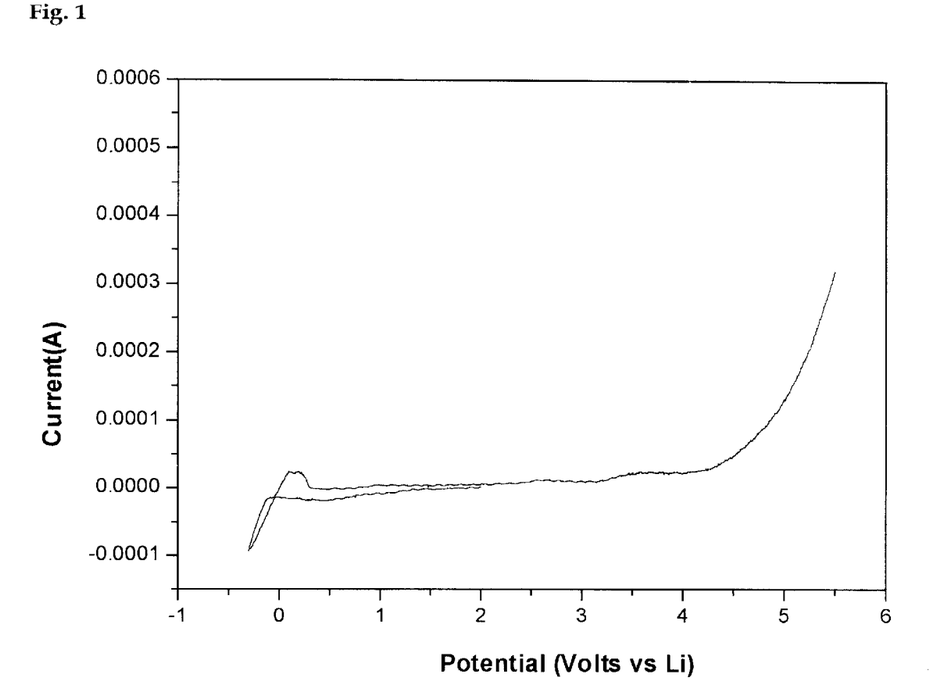
FIG. 1 is a graph which shows the electrochemical stability of the cross-linking solid polymer electrolytes of the present invention.

A cell to measure the electrochemical stability was prepared by directly coating a solid polymer electrolyte film on top of a stainless steel electrode (1 cm×1 cm), covering with lithium foil, and packing it under vacuum using a metallized bag. Electrochemical stability was measured at the sweep rate of 1 mV/sec in the potential range of −0.3~5.5 V by means of linear sweep voltammetry. The result showed that there was a reversible plating and stripping of lithium in the potential range of −0.3~0.2 V. No significant oxidative degradation of polymer electrolyte was observed until potential was less than 4.75V. Thus the resulting polymer electrolytes were shown to be electrochemically stable up to 4.75 V against lithium reference electrode and were thus confirmed that these electrolytes have enough electrochemical stability to use as electrolytes for lithium-polymer batteries.

As described above, the cross-linking agent used in the present invention as a component of the solid polymer electrolyte composition has a structure wherein at least two phenyl alkyleneglycol acrylates are introduced in the center of a linking molecule, and the solid polymer electrolyte prepared using this cross-linking agent results in having a three-dimensional network structure wherein a hard segment having at least two benzene molecules form the core of the cross-linking thereby much improving mechanical properties such as stretching or bending and also keeping regular distances between linear or branched polymer backbones. Still further, polyalkylene oxide is linked as a soft segment at the terminal end of the cross-linking agent thus increasing its compatibility with low molecular weight polyalkylene oxide added as a plasticizer or a non-aqueous polar solvent thus increasing the flexibility of the electrolytic film. Consequently, the solid polymer electrolyte according to the present invention has bifunctional characteristics of increased physical property as well as ion conductivity and is thus useful for manufacturing a high capacity lithium-polymer secondary battery.

What is claimed is:
1. A polyalkylene oxide solid polymer electrolyte composition comprising:
(a) 3–30% by wt of a lithium salt;
(b) 0.1–80% by wt of a cross-linking agent having the following formula (I);
(c) 0.1–70% by wt of polyalkyleneglycol alkylether alkyl (metha)acrylate having the following formula (II);

(d) 0.1–80% by wt of a single compound or a mixture of at least two compounds which are polyalkyleneglycol dialkylethers having the following formula (III), or a nonaqueous polar solvent; and e) 0.5–5% by wt of a curable initiator;

wherein X represents wherein X represents

R represents a linear or branched alkyl group of $C_1$–$C_{10}$;

$R_1$, $R_2$, $R_3$, $R_4$, $R_5$, $R_6$ and $R_7$ each independently represent a hydrogen atom or a methyl group;

$R_8$, represents a linear or branched alkyl group of $C_1$–$C_{10}$;

j is 2; and p, q and r each independently represent an integer of 0–20.

2. The polyalkylene oxide solid polymer electrolyte composition of claim 1, wherein said lithium salt is selected from the group consisting of $LiClO_4$, $LiCF_3SO_3$, $LiBF_4$, $LiPF_6$, $LiAsF_6$ and $Li(CF_3SO_2)_2N$.

3. The polyalkylene oxide solid polymer electrolyte composition of claim 2, wherein said lithium salt is $LiCF_3SO_3$.

4. The polyalkylene oxide solid polymer electrolyte composition of claim 1, wherein said polyalkyleneglycol alkylether alkyl(metha)acrylate is present in amount of 5–60% by wt.

5. The polyalkylene oxide solid polymer electrolyte composition of claim 1, wherein said cross-linking agent of the formula (I) is present in an amount of 5–60% by wt.

6. The polyalkylene oxide solid polymer electrolyte composition of claim 1, wherein the lithium salt is present in an amount of 5–15% by wt.

7. The polyalkylene oxide solid polymer electrolyte composition of claim 1, wherein the polyalkyleneglycol dialkylether of the formula (III) is used and are selected from the group consisting of polyethyleneglycol dimethylether, polyethyleneglycol diethylether, polyethyleneglycol dipropylether, polyethyleneglycol dibutylether, polyethyleneglycol diglycidylether, polypropyleneglycol dimethylether, polypropyleneglycol diglycidylether, a comonomer between polypropyleneglycol/polyethyleneglycol at the terminal end of dibutylether, and a copolymer among polyethyleneglycol/polypropyleneglycol blocks.

8. The polyalkylene oxide solid polymer electrolyte composition of claim 1, wherein the nonaqueous polar solvent is used and is selected from the group consisting of ethylenecarbonate, propylenecarbonate, butylenecarbonate, dimethylcarbonate, tetrahydrofuran, α-methyltetrahydrofuran, 1,3-dioxolane, 4,4-dimethyl-1-1,3-dioxolane, α-butyrolactone and acetonitrile.

9. The polyalkylene oxide solid polymer electrolyte composition of claim 1, wherein the curable initiator is a photo initiator.

10. The polyalkylene oxide solid polymer electrolyte composition of claim 1, wherein the curable initiator is a thermal initiator.

11. The polyalkylene oxide solid polymer electrolyte composition of claim 1, wherein X in the formula (I) is selected from the group consisting of 12. A solid polymer electrolyte film comprising the polyalkylene oxide solid polymer electrolyte composition of claim 1.

13. The solid polymer electrolyte film of claim 12, having a thickness of less than 40 μm.

14. The solid polymer electrolyte film of claim 12, comprising up to 70% by wt. of (d) as a plasticizer.

15. The solid polymer electrolyte film of claim 12, having a tensile strength of higher than 3 Mpa.

16. The solid polymer electrolyte film of claim 12, having a maximum rate of stretching higher than 30%.

17. A lithium-polymer secondary battery comprising the polyalkylene oxide solid polymer electrolyte composition of claim 1.

* * * * *